United States Patent [19]
Nishibayashi

[11] Patent Number: 6,031,285
[45] Date of Patent: Feb. 29, 2000

[54] HEAT SINK FOR SEMICONDUCTORS AND MANUFACTURING PROCESS THEREOF

[75] Inventor: Yoshiki Nishibayashi, Itami, Japan

[73] Assignee: Sumitomo Electric Industries, Ltd., Osaka, Japan

[21] Appl. No.: 09/120,453

[22] Filed: Jul. 23, 1998

[30] Foreign Application Priority Data

Aug. 19, 1997 [JP] Japan ................................. 9-222091

[51] Int. Cl.$^7$ ................................................. H01L 23/10
[52] U.S. Cl. .......................... 257/706; 257/703; 428/325; 428/660
[58] Field of Search ................. 257/706, 702, 257/713, 703; 428/325, 660

[56] References Cited

U.S. PATENT DOCUMENTS

| | | | |
|---|---|---|---|
| 5,045,972 | 9/1991 | Supan et al. | 361/706 |
| 5,120,495 | 6/1992 | Supan et al. | 419/11 |
| 5,130,771 | 7/1992 | Burnham et al. | 257/675 |
| 5,645,937 | 7/1997 | Noda et al. | 428/408 |
| 5,783,316 | 7/1998 | Collela et al. | 428/660 |
| 5,786,075 | 7/1998 | Mishuku et al. | 428/325 |

FOREIGN PATENT DOCUMENTS

| | | |
|---|---|---|
| 459474 | 12/1991 | European Pat. Off. . |
| 0717125 | 6/1996 | European Pat. Off. . |
| 0726330 | 8/1997 | European Pat. Off. . |
| 3-9552 | 1/1991 | Japan . |
| 4-231436 | 8/1992 | Japan . |
| 9-184036 | 7/1997 | Japan . |
| WO 9504165 | 2/1995 | WIPO . |

*Primary Examiner*—Mahshid Saadat
*Assistant Examiner*—Jhihan B Clark
*Attorney, Agent, or Firm*—Smith, Gambrell & Russell, LLP

[57] ABSTRACT

A highly heat conductive heat sink comprising diamond particles yet eliminating heat distortion problems caused by the difference in thermal expansion with a semiconductor, and a manufacturing method thereof. Melting of an alloy (C), which comprises a metal (A) of at least one metal selected from the group consisting of Cu, Ag, Au, Al, Mg, and Zn; and a metal (B) of at least one metal selected from the group consisting of the groups 4*a* and 5*a* of the Periodic Table and chromium, around diamond particles forms on the surface thereof a metal carbide (B'), which enables the strong bonding between the diamond particles and the metal (A) and thus produces a highly heat conductive heat sink having a much higher thermal conductivity than the metal (A). This structure is attainable by either an infiltration method or sintering method. A special feature, or effectiveness, of the invention lies in that the metal carbide (B') is formed on the surface of the diamond particles at the same time as or after the formation of a metal matrix. It is essential that not less than a quarter of the surface of the diamond particles be covered with the metal carbide (B') and the diamond particles be separated with one another by metal.

14 Claims, 7 Drawing Sheets

(a)

(b)

(c)

(d)

(a)

(b)

(c)

(d)

(e)

(f)

(a)

(b)

7 Separately provided metal (A)

(c)

8 Two Components of molten Alloy (C) and non-molten separately provided metal (A)

(d)

Enlarged (e)

9 Molten Alloy (C) and molten separately provided metal (A)

Enlarged (a)

(b)

(c)

pressure formation (d)

Sintering (e)

HEAT SINK FOR SEMICONDUCTORS AND MANUFACTURING PROCESS THEREOF

BACKGROUND OF THE INVENTION

1. Field of the Invention

The present invention relates to a heat sink for heat dissipation of devices such as semiconductors and the manufacturing process thereof.

2. Description of the Background Art

Heat sinks are generally used as a means to cool semiconductors and other similar devices. Such heat sinks must instantaneously dissipate the heat that is rapidly produced in an element of semiconductors and other similar devices. To meet this requirement it is effective to use materials having a high heat dissipation property, which depends on the thermal conductivity and a specific heat thereof. Copper was once considered an appropriate candidate material because of its relatively high thermal conductivity of 398 W/mK and high specific gravity. However, copper has a coefficient of thermal expansion as high as 17 ppm/° C. compared with that of semiconductors and ceramics for insulation; for example, 4.2 ppm/° C. for silicon and 6.7 ppm/° C. for GaAs. Consequently, when copper is joined with a semiconductor, due to the discrepancy in thermal expansion in the two components when the joined body is subjected to temperature variations both at the time of joining and during operation, too large a thermal stress is applied to the semiconductor, making this combination impractical in many instances.

Another idea is to use an alloy of copper and a metal having a small coefficient of thermal expansion such as tungsten or molybdenum. An alloy or dispersed body such as Cu—W or Cu—Mo system is used because the coefficient of thermal expansion of these materials is similar to that of a semiconductor. However, tungsten and molybdenum have a low thermal conductivity so that their alloys with copper exhibit conductivity no more then about 200 W/mK, which is less than desirable.

Another idea is to use a combination of metal and diamond, which has a high thermal conductivity. A variety of techniques stemming from this idea is disclosed in U.S. Pat. Nos. 5,045,972 and 5,130,771 and unexamined published Japanese patent applications Tokukaihei 3-9552 and Tokukaihei 4-231436. All these techniques take advantage of the high thermal conductivity of diamond in that by embedding it into metal and adjusting its volume ratio to bring the coefficient of thermal expansion of the total system closer to that of a semiconductor so that a thermal distortion caused by the difference in expansion between the two components will be eliminated when the joined body is subjected to temperature variations.

However, when diamond particles are simply embedded into a metal such as Cu, Ag, Au, and Al, due to poor bonding of diamond with these metals, the mechanical strength as a heat sink is intolerably weak and mixing cannot be performed thoroughly during the manufacturing process. To solve these problems, there is another idea, in which the surface of the diamond particles is coated with metal by special means before sintering with a metal such as Cu, Ag, Au, and Al. Although this method provides easy forming and enables the controlling of the composition, the final product manufactured with a conventional metal sintering process through mixing of powder, compacting under pressure, and sintering shows a thermal conductivity of no more than that of the metal used. In yet another method to cope with this problem, before embedding in a molten metal, diamond particles are coated with a metal capable of forming carbide with diamond. This method, although apparently similar to the invention, is not considered a solution to the problem because the metal used to produce the carbide remains around the diamond particles so that the excellent thermal conductivity of diamond cannot be fully utilized.

SUMMARY OF THE INVENTION

According to the invention to solve the aforementioned problem, a heat sink for semiconductors has a structure which comprises a metal (A) of at least one metal selected from the group consisting of Cu, Ag, Au, Al, Mg, and Zn; a carbide (B') made from a metal (B) of at least one metal selected from the group consisting of the groups 4a and 5a of the Periodic Table and chromium; and a plurality of the diamond particles, the heat sink having a structure wherein more than a quarter of the surface of individual diamond particles is covered with the metal carbide (B') and the diamond particles covered with the metal carbide (B') are separated from one another by the metal (A).

Such a structure provides increased bonding between the diamond particle and the surrounding metal, and also provides reasonable bonding between the diamond particle and the metal carbide (B') and around the same bonding between the metal carbide (B') and the neighboring metal (A). In thermal behavior, this structure can provide high thermal conductivity that is unattainable only with the metal (A). Especially, the condition wherein a quarter or more of the surface of the diamond particle is covered with the metal carbide (B') secures the strong bonding between the diamond particle and the metal (A). When less than a quarter of the surface is covered, the bonding strength between the diamond particle and the metal (A) is insufficient, because at 150° C. the heat sink softens and deforms by a load of 30 g/cm$^2$. It is noted that the thinner the layer of the metal carbide (B'), the better, because a trace of metal carbide that sticks to the surface of the diamond particle is sufficiently effective and a thicker layer has an adverse effect owing to the inferior thermal conductivity of the metal (B'). Another factor to reduce the thermal conductivity of a heat sink is the ample presence of the unreacted metal (B) around the diamond particles.

A metal (D) of at least one metal selected from the group consisting of tungsten, molybdenum, and alloys thereof may be dispersed in the metal (A). The metal (D) has a function of absorbing the difference in thermal expansion between the metal (A) and the diamond particles. It is preferable that the average diameter of the diamond particles be in a range of 60 to 700 $\mu$m. If it is less than 60 $\mu$m, the high thermal conductivity of the diamond cannot be exploited, and if more than 700 $\mu$m, there is no room for the diamond particles to align in layer with thin heat sinks. It is further preferable that the ratio of the number of atoms in the metal (B) to that in the total heat sink be not less than 0.01 atm % and not more than 2.5 atm %. The metal (B) exists in the form of the metal carbide (B') around the individual diamond particles. When the metal carbide (B') covers less than a quarter of the diamond surface, which corresponds to less than 0.01 atm % in the ratio of the number of atoms, a strong bonding cannot be expected. Conversely, when the layer is too thick, corresponding to more than 2.5 atm %, a high thermal conductivity cannot be expected due to the inferior thermal conductivity of the metal carbide (B').

A more preferable solution is obtained when the metal (B) comprises at least one metal selected from the group consisting of Ti, Zr, and Hf, and the ratio of the number of atoms in the metal (B) to that in the total heat sink is not less than 0.01 atm % and not more than 2.5 atm %, because under these conditions a strong bonding is provided between the metal (B'), the diamond particles, and the metal (A) acting as a matrix, and a suitable thickness of the metal (B') is maintained so that the superior thermal conductivity of the diamond is utilized.

A yet more preferable result can be obtained when a metal (A) comprises an alloy of silver and copper under the condition that Ag≧0.6 or Cu≧0.8 in the volume ratio between the two is fulfilled. That the alloy is of silver and copper automatically signifies effectiveness in thermal conductivity, and it is essential to maintain the condition that either one of the component metals keeps its dominance over the other in the volume ratio. The reason is that given the greater ratio of either silver or copper, there are rich parts of either silver or copper in the alloy so that the total thermal conductivity becomes closer to that of the single metal itself.

Conversely, if the condition is either 0.2<Ag<0.6 or 0.4<Cu<0.8, the thermal conductivity of the alloy parts dominates the total characteristic, failing to exhibit such a high thermal conductivity as the single metal itself does; i.e., the advantageous properties of diamond particles and metal cannot be exploited and the heat sink will suffer an inferior thermal conductivity.

A manufacturing method to form a heat sink comprising the metal (A), the metal carbide (B'), and the diamond particles may include the following:
 (a) putting a plurality of diamond particles in a container or mold;
 (b) putting an alloy (C) comprising the metal (A) and metal (B) in a container or mold together with the diamond particles at the same time or after the diamond particles are introduced; and
 (c) melting the alloy (C) with heat in a vacuum or at a pressure below 1000 atms so that the metal (B) released from the alloy (C) reacts with the diamond particles to form the metal carbide (B') on the surface of individual diamond particles and the molten alloy (C) infiltrates into the gaps between the diamond particles.

Another manufacturing method for the same purpose may include the following:
 (a) putting a plurality of diamond particles in a container or mold;
 (b) putting the alloy (C) comprising the metal (A) and the metal (B) in a container or mold together with the diamond particles at the same time or after the diamond particles are introduced;
 (c) melting the alloy (C) with heat in a vacuum or at a pressure below 1000 atms so that the metal (B) released from the alloy (C) reacts with the diamond particles to form the metal carbide (B') on the surface of individual diamond particles;
 (d) evaporating a part of the alloy (C) in a vacuum; and
 (e) infiltrating the metal (A), which is separately provided, in a vacuum or at a pressure below 1000 atms.

Yet another manufacturing method for the same purpose may include the following:
 (a) putting a plurality of diamond particles in a container or mold;
 (b) putting the alloy (C) comprising the metal (A) and the metal (B) together with the metal (A), which is separately provided, having a higher melting point than the alloy (C) in the container or mold together with the diamond particles at the same time or after the diamond particles are put;
 (c) melting the alloy (C) with heat in a vacuum or at a pressure below 1000 atms so that the metal (B) released from the alloy (C) reacts with the diamond particles to form the metal carbide (B') on the surface of individual diamond particles; and
 (d) melting the separately provided alloy (A).

Contrary to the above, using the separately provided metal (A) having a lower melting point than the alloy (C) can achieve the same purpose. That is to say, the process may include the following:
 (a) putting a plurality of diamond particles in a container or mold;
 (b) putting the alloy (C) comprising the metal (A) and metal (B) together with the metal (A), which is separately provided, having a lower melting point than the alloy (C) in the container or mold together with the diamond particles at the same time or after the diamond particles are put;
 (c) melting the separately provided metal (A) with heat in a vacuum or at a pressure below 1000 atms; and
 (d) melting the alloy (C) so that the metal (B) released from the alloy (C) reacts with the diamond particles to form the metal carbide (B') on the surface of individual diamond particles.

The above is a means called an infiltration method to manufacture the heat sink of the invention. The heat sink of the invention may also be manufactured by another means called a sintering method including the following:
 (a) mixing powders of the alloy (C) comprising the metal (A) and the metal (B) with a plurality of diamond particles;
 (b) pressure forming the mixture; and
 (c) sintering the formed body at a temperature above the melting point of the alloy (C) so that the metal (B) included in the alloy (C) reacts with the diamond particles to form the metal carbide (B') around the diamond particles.

With the aforementioned method, an alternate method featuring the use of the separately provided metal (A) at the time of mixing to manufacture the heat sink of the invention may include the following:
 (a) mixing powders of the alloy (C) comprising the metal (A) and the metal (B); powders of the metal (A), which are separately provided, having a higher melting point than the alloy (C); and a plurality of diamond particles;
 (b) pressure forming the mixture; and
 (c) sintering the formed body at a temperature above the melting point of the alloy (C) and below the melting point of the separately provided metal (A) so that the metal (B) released from the alloy (C) reacts with the diamond particles to form the metal carbide (B') around the diamond particles.

Yet another sintering method to manufacture the heat sink of the present invention may include the following:
 (a) mixing powders of the alloy (C) comprising the metal (A) and the metal (B); powders of the metal (D), which comprises at least one metal selected from the group consisting of tungsten, molybdenum, and alloys thereof, having a higher melting point than the alloy (C); and a plurality of diamond particles;
 (b) pressure forming the mixture; and
 (c) sintering the formed body at a temperature above the melting point of the alloy (C) and below the melting point of the metal (D) so that the metal (B) included in the alloy (C) reacts with the diamond particles to form the metal carbide (B') around the diamond particles.

This is a good method because it enables the adjustment of the coefficient of there expansion especially by the inclusion of at least one kind of the metal selected from the group consisting of tungsten, molybdenum, and alloys thereof.

Yet a further sintering method to manufacture the heat sink of the invention may include the following:

(a) mixing powders of the alloy (C) comprising the metal (A) and the metal (B); powders of the metal (A), which are separately provided, having a higher melting point than the alloy (C); and a plurality of diamond particles;

(b) pressure forming the mixture; and (c) sintering the formed body at a temperature above the melting point of the separately provided metal (A) so that the metal (B) included in the alloy (C) reacts with the diamond particles to form the metal carbide (B') around the diamond particles.

The feature offered by the infiltration method is that the metal (A) and metal (B) constitute the alloy (C), which is melted with heat in a vacuum or at a pressure below 1000 atms in contact with the diamond particles to enable the metal (B) released from the alloy (C) to disperse over the surface of individual diamond particles and form the metal carbide (B') as a result of the reaction with the diamond there. Because the metal (B) is more inclined to be carbonized when in contact with diamond than the metal (A), the metal carbide (B') is selectively produced, which encloses the diamond particles. Such processes are included in all of the above-mentioned four methods any one of which, therefore, can supply the product of equivalent quality.

The feature offered by the sintering method as an alternative means is similar to that by the above-mentioned infiltration method in that when the diamond particles and powders of the alloy (C) are sintered inside the formed body, the metal (B) included in the alloy (C) reacts with the diamond particles to form the metal carbide (B') on the surface of the individual diamond particles. It is an important point in the invention that the metal (B) included in the alloy (C) reacts selectively with the diamond particles even then the formed body includes the metal (A) or metal (D). This point is common to the above-mentioned four methods.

According to the present invention, it is possible to furnish a heat sink with a high thermal conductivity, substantially higher than the thermal conductivity of the metal used, due to the superior thermal conductivity of diamond particles. Because the heat sink has an intermediate coefficient of thermal expansion between that of a heat sink with a metal base and that of diamond, thermal distortion problems caused by a joined semiconductor is effectively eliminated. Therefore, the present invention is especially effective in a heat sink for semiconductors that generate a large amount of heat or that generate heat instantaneously.

DETAILED DESCRIPTION OF THE INVENTION

Figure 1:
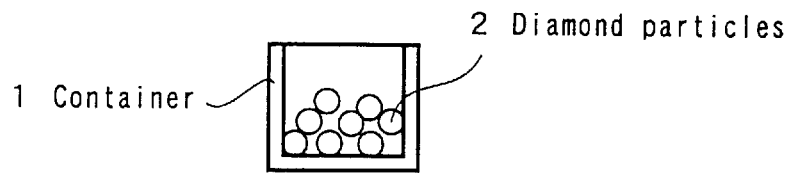
FIG. 1 is an illustration of a manufacturing method using the infiltration method of the invention. In steps (a) and (b), diamond particles 2 are put in a container 1 simultaneously with the alloy (C) 3 or before the alloy (C) 3 is introduced, and in step (c), the alloy (C) 3 is melted, the molten alloy (C) being 4. In step (d), the metal carbide (B') 5 is formed on the surface of individual diamond particles 2. The formed body is removed after it is cooled.
Figure 1:
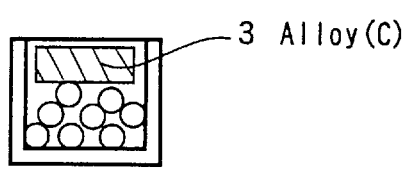
Figure 1:
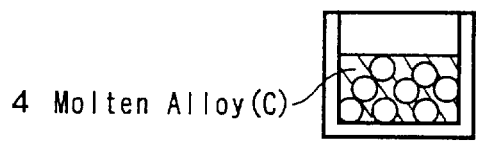
Figure 1:
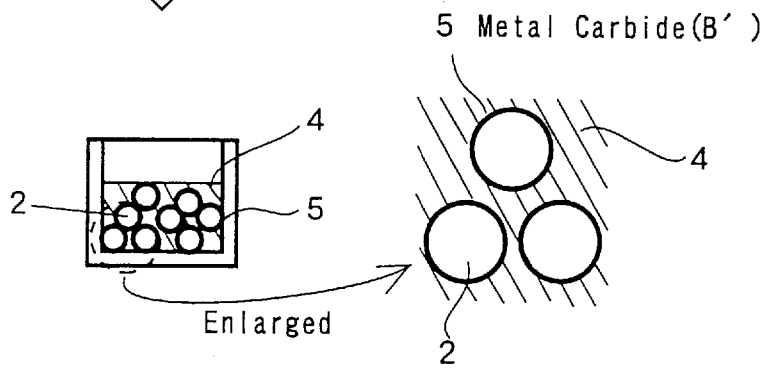

The gist of the present invention is that a metal (B), which comprises at least one metal selected from the group consisting of the groups 4a and 5a of the Periodic Table and chromium, forms a metal carbide (B') on the surface of individual diamond particles, and the metal carbide (B') is enclosed by a metal (A) comprising at least one metal selected from the group consisting of Cu, Ag, Au, Al, Mg, and Zn, and the metal (A) constitutes the matrix of a heat sink. A heat sink formed only with diamond particles is ideal in terms of thee conduction, but its thermal expansion is smaller than that of semiconductors and thus causes thermal distortions. This requires the absorption of the difference in thermal expansion between the two components by the metal (A). However, it is difficult to obtain sufficient bonding strength between the diamond particles and the metal (A). The present invention is to cope with this problem.

It is possible to maintain strong bonding between the diamond particles and the metal (A) by the intervention of the metal carbide (B') made of the metal (B). The thermal conductivity can be improved by adding the superior conductivity of diamond to the conductivity of the single metal (A) itself. In addition, dispersion of the metal (D), which comprises at least one metal selected from the group consisting of tungsten, molybdenum, and alloys thereof, into the metal (A) creates an effect to absorb the difference in the coefficient of thermal expansion between the diamond particles and the metal (A) so that the more stable heat sink is obtained.

Thermal conduction is carried out by mutual transfer of heat between different kinds of material through the strongly bonded interface as in the present invention. If the bonding at the interface is insufficient, the thermal conduction is determined by the thermal conductivity specific to the material used as a matrix. More specifically, regardless of the amount of diamond particles having a high thermal conductivity that are embedded into the matrix of the metal (A), the thermal conduction as a whole is determined by the thermal conductivity of the metal (A) unless the bonding at the interface is of sufficient strength, offering little effect despite using expensive diamond particles.

When materials with different coefficient of thermal expansion are joined, expansion causes an internal stress on either of the materials. The metal (A) is subjected to this stress in the present invention. The metal (A) around diamond particles has a larger coefficient of thermal expansion than diamond particles, whose coefficient of thermal expansion is as small as 1.5 ppm/° C. in a range from temperature to 200° C. Hence, at an elevated temperature, the metal (A) is subjected to an internal stress due to the restriction by the smaller expansion of the diamond particles making the coefficient of thermal expansion of the heat sink as a whole smaller than that of the metal (A). To produce such condition evenly throughout the heat sink, it is desirable that the individual diamond particles be separately placed in the matrix of metal (A) without touching one another. Such a constitution enables the uniform distribution of the individual internal stress in the heat sink as a whole, thus preventing the distortion of the heat sink. The special feature of the present invention is that the heat sink has such a constitution as the diamond particles are covered with the metal carbide (B'), which, in turn, is enclosed by the metal (A).

In terms of bonding strength between the diamond and the metal (A), the best condition is that the metal carbide (B') encloses the entire surface of the diamond particles. However, it has been found that when at least a quarter of the surface of diamond particles is covered by the metal carbide (B'), a sufficient effect is obtained. To secure stable conditions, it is preferable that not less than half the surface of the diamond particles is covered with the metal carbide (B'). The remaining parts can be either the metal (A) or pores, though it is preferable to have fewer pores.

The choice of the diameter of the diamond particles depends on the size of the heat sink. If the particles are too small, the total thermal conductivity is reduced due to increased interfaces between the particles and the metal. If too large, it will limit the thickness of the heat sink. The reasonable diameter is between 60 and 700 $\mu$m. The most preferable diameter is between 200 and 300$\mu$m.

The desirable volume ratio of the diamond particles to the total volume of the heat sink is 30 to 70 vol % taking into account thermal conductivity and expansion. If it is less than 30 vol %, an effective thermal conduction cannot be obtained. If more than 70 vol %, the adjustment of the coefficient of thermal expansion with a semiconductor becomes difficult, though the thermal conductivity will increase. When the volume ratio of the diamond particles lies between 45 and 65 vol %, the thermal conductivity is sufficiently high and the internal stress due to thermal expansion is suppressed, hence preferable.

The purpose of the metal carbide (B') is to improve the bonding strength between the diamond particles and the metal (A). If the volume of the metal carbide (B') is too large, the total thermal conductivity will decrease because of its poor thermal conductivity. If too small, the bonding strength cannot be improved. The desirable amount of the metal carbide (B') is between 0.01 and 2.5 atm % in the ratio of the number of atoms to that of the total heat sink. In this range, the bonding strength between the diamond particles and the metal (A) is sufficient, and the total thermal conductivity becomes larger than that of the metal (A) without suffering the reduction due to the presence of the metal carbide (B').

An especially preferable result will be given when the metal carbide (B') is formed by the metal (B) comprising at least one metal selected from the group consisting of Ti, Zr, and Hf and having a ratio of the number of atoms from 0.01 to 2.5 atm % of the total heat sink, because the effect of the metal carbide (B') becomes more evident. If the ratio of the number of atoms is less than 0.01 atm %, the amount will be insufficient to cover the surface of the diamond particles, so that the resultant bonding is too weak to prevent the deformation of the completed heat sink at an elevated temperature. If more than 2.5 atm %, the thermal conductivity will decrease due to the excessive amount of metal carbides against the total heat sink.

Figure 6:
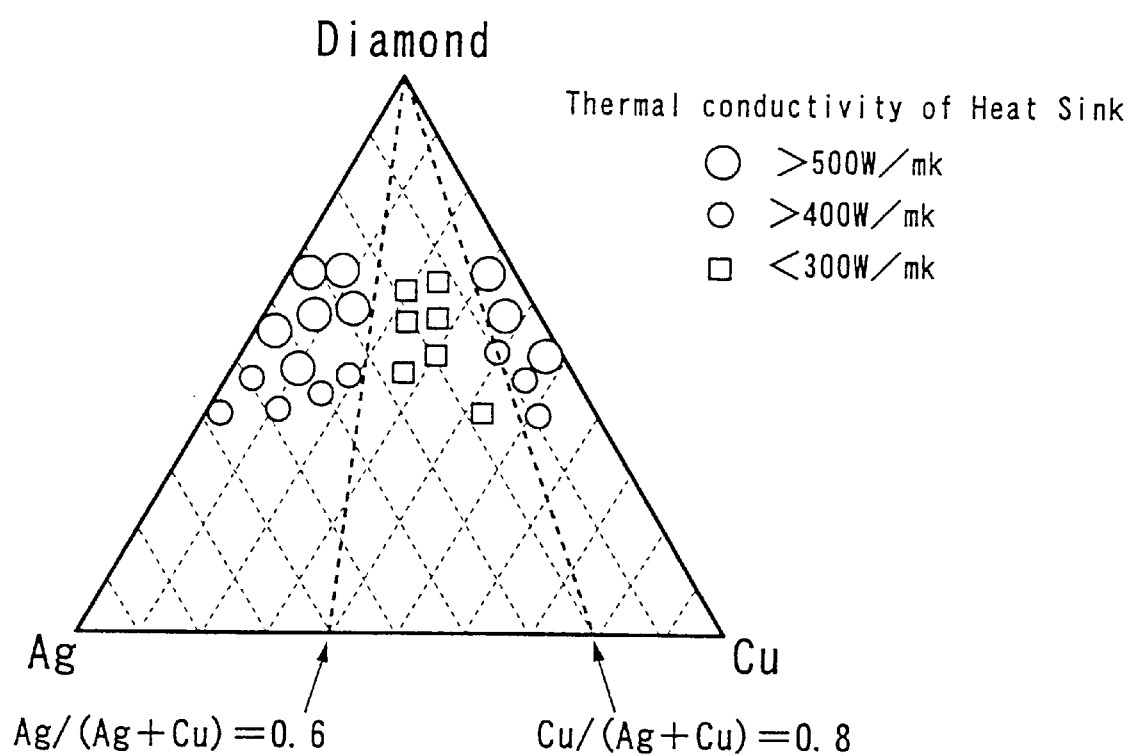
FIG. 6 is a graph showing the ratio of composition when an alloy of silver and copper is used as the metal (A) in the invention and to show how the thermal conductivity of the heat sink is affected by the ratio.

Furthermore, the metal (A) exhibits its utmost effect when it is composed of silver and copper. The volume ratio of silver or copper to the alloy determines the effect. More specifically, when Ag$\geq$0.6 if Ag is dominant and Cu$\geq$0.8 if Cu is dominant, the thermal conductivity becomes sufficiently high. Therefore, in the design of the composition of the metal (A), when a much larger volume ratio is allocated to either one of the constituents than the other, the total thermal conductivity approaches the conductivity of the dominant element, and a structure is obtained in which the superior thermal conductivity of diamond is readily exploited. The desirable volume ratio of an alloy differs with the selected element. The combination of silver and copper is the most desirable and the above-mentioned volume ratio is the most suitable to this combination. In this ratio, the use of titanium as the metal (B) exhibits a distinct effect. The data obtained from this combination is shown in FIG. 6. FIG. 6 is a graph of the ternary system denoting the volume ratio of diamond particles, silver, and copper in a completed heat sink, indicating that the thermal conductivity of a completed heat sink varies with the volume ratio of silver and copper, both of which constitute the metal (A).

A heat sink with such a constitution can be manufactured by the processes described below. The first process is the infiltration method. Four methods in this category are described below. In the first method, a plurality of diamond particles are put in a container of a material having a higher melting point than the metal (A) and having little wettability to the metal (A), such as quartz or carbon, together with the alloy (c) made of the metal (A) and metal (B) at the same time or before the alloy (C) is added. The container is heated in a furnace in a vacuum or at a pressure below 1000 atms in a non-oxidizing atmosphere. In 0.5 to 10 minutes under these conditions, the metal (B) included in the alloy (C) is dispersed around the diamond particles to form the metal carbide (B') on the surface of the individual diamond particles, the alloy (C) itself infiltrating into the gaps between the diamond particles, reducing the total dimensions. The completed body is removed after it is cooled.

The second method is almost the same as the first except that the alloy (C) evaporates in a vacuum after melting. When the evaporation reaches a certain extent, a separately provided metal (A) is added and heated to infiltrate into the gaps in a vacuum or under a pressure below 1000 atms. The composition of the separately provided metal (A) may differ from that of the metal (A) included in the alloy (C).

The third method specifies the selection of the metal (A). Another metal (A) is separately provided apart from the metal (A) constituting the alloy (C) together with the metal (B). The separately provided metal (A) is so selected that it has a higher melting point than the alloy (C) so that the alloy (C) can selectively melt when it is heated together with the diamond particles and the separately provided metal (A) in a vacuum or at a pressure below 1000 atms.

When the alloy (C) is melted and the metal carbide (B') is formed on the surface of the diamond particles, there are two kinds of metal (A) in the container, i.e., the metal (A) included in the alloy (C) and the separately provided metal (A). Materials for the two kinds of metal (A) may either be the same or different from each other. When the same material is used, the metal (A) must decrease the melting point of the alloy (C) that the metal (A) constitutes with the metal (B). After the alloy (C) is melted, heating is continued to raise the temperature beyond the melting point of the separately provided metal (A) so that it can infiltrate into the gaps.

The fourth method also specifies the selection of the metal (A). Similarly, another metal (A) is separately provided in addition to the metal (A) constituting the alloy (C) together with the metal (B). The separately provided metal (A) is so selected that it has a lower melting point than the alloy (C) so that the separately provided metal (A) can selectively melt when it is heated together with the diamond particles and the alloy (C) in a vacuum or at a pressure below 1000 atms. When heated, the separately provided metal (A) will melt first and form liquid drops of molten metal between the diamond particles or at places remote from the diamond particles. Heating is continued to melt the alloy (C) so that it will infiltrate into the gaps between the diamond particles and the liquid drops of the metal (A), and the metal (B) released from the alloy (C) will react with the diamond particles to form the metal carbide (B'). Immediately after this reaction, the alloy (C) and the separately provided metal (A) are dispersed among the diamond particles. Under these conditions, a film of the metal carbide (B') is formed on the surface of the diamond particles, which is enclosed by the alloy (C), whose gaps are filled by the separately provided metal (A). The above describes the manufacturing process by the infiltration method according to the present invention.

The other process to manufacture the heat sink according to the present invention is the sintering method. Four methods in this category are described below. In the sintering method all the materials except diamond particles are pulverized and mixed. By sintering the formed body, the metal (B) included in the alloy (C) is dispersed on the surface of the diamond particles to form the metal carbide (B').

In the first method, the diamond particles and powders of the alloy (C) made of the metal (A) and metal (B) are mixed. Although the mixing may be carried out by either a dry method or a wet method, the wet method by the use of an organic solvent or other agent is preferable to obtain a uniform mixture because the mixing is for different forms of materials such as particles and powders. The mixture, dried if necessary, is pressure formed in a mold. The formed body is sintered in a furnace. The sintering is performed in a non-oxidizing atmosphere or reducing atmosphere at a temperature slightly higher than the melting point of the alloy (C) . When melting, the alloy (C) will enclose the diamond particles and the metal (B) included in the alloy (C) will react with the diamond particles at the surface to form the metal carbide (B'), producing the bonding between the diamond particles and the metal. Removed from the mold after cooling, the sintered body is ground and processed for finishing for the designed size of heat sink.

In the second method, the diamond particles are mixed with the powders of the alloy (C) made of the metal (A) and metal (B), and powders of the separately provided metal (A) having a higher melting point than the alloy (C). Although the mixing may be carried out by either the dry method or the wet method, the wet method by the use of an organic solvent or other agent is preferable to obtain a uniform mixture. The mixture is pressure formed in a mold. The formed body must be dried if wet mixing is employed. The formed body is sintered in a furnace. The sintering is performed at a temperature higher than the melting point of the alloy (C) and lower than that of the separately provided metal (A) to melt the alloy (C) selectively. The metal (B) included in the alloy (C) reacts with the diamond particles at the surface to form the metal carbide (B'). The heating and cooling are carried out in a non-oxidizing atmosphere. If cooled without further heating, the separately provided metal (A) remains as powders. If the heating is continued, powders of the separately provided metal (A) melt to form a metal matrix together with the alloy (C). Either method can furnish the heat sink of the present invention.

In the third method, the same materials as the second method are provided. However, the formed body is sintered at a temperature higher than the melting point of the separately provided metal (A). Both the alloy (C) and the separately provided metal (A) melt at the same time and constitute a matrix. While melting, the metal (B) included in the alloy (C) forms the metal carbide (B') at the surface of the diamond particles. When a relatively large amount of diamond particles is used, the surface tension of the molten metal attracts diamond particles and keeps the form overcoming the contraction force. The probability that the metal (B) included in the alloy (C) contacts with the surface of the diamond particles and forms the metal carbide (B') is reduced due to the presence of the separately provided metal (A). When the metal carbide (B') is formed on at least a quarter of the surface of the diamond particles, the bonding between the diamond particles and metal is sufficient. The existence of pores in the completed product causes no problem.

The fourth method is a variation of the second method and the heat sink includes a metal (D) comprising at least one metal selected from the group consisting of tungsten, molybdenum, and alloys thereof. The diamond particles, powders of the alloy (C), and powers of the metal (D) are provided. Powers of a separately provided metal (A) may be added at the same time. The metal (D) has a higher melting point than the alloy (C) or the separately provided metal (A) because of the presence of tungsten and molybdenum. When a formed body made of the diamond particles, powders of the alloy (C), and powders of the metal (D)—and yet powders of the separately provided metal (A), if used—is heated in the sintering process, the metal (D) will not melt. The metal (D) has no influence on the metal (B) forming the metal carbide (B') on the surface of the diamond particles. Powders of the metal (D) are fixed on cooling by the alloy (C). Thus completed is a heat sink that includes the metal (D) in addition to the diamond particles, the metal carbide (B') over the same, and the metal (A). This heat sink makes it easy to adjust the coefficient of thermal expansion of the same with the help of the metal (D). Having an intermediate coefficient of heat expansion between the low coefficient of the diamond particles and the high coefficient of the metal (A), the metal (D) absorbs the stress concentration due to uneven thermal strain in the heat sink as a whole.

The methods described above are for the manufacture of the heat sink according to the present invention. Other methods may also be employed. As for the selection of materials for manufacture, the metal may be of either powder or mass in the infiltration method. In the sintering method, the metal should be of powder or granule. Especially, so that the powder of the alloy (C) adheres selectively to the surface of the diamond particles, the diamond particles and the pulverized alloy (C) should be mixed by a wet method with an organic solvent or other agent so that the diamond particles are enclosed by the alloy (C), before being mixed with other materials. In this way, the formation of the metal carbide (B') is secured.

Amounts of the diamond particles and the alloy (C) can be decided based on the designed figures of the thermal conductivity and coefficient of thermal expansion for the heat sink. It is essential to secure the amount of the metal (B) because the presence of the metal carbide (B') plays an important role in the property of the heat sink.

As mentioned above, there are at least eight methods to produce the heat sink according to the invention. All of them can produce a heat sink with a thermal conductivity better than that of the metals used and with a coefficient of thermal expansion smaller than that of the metal (A) and larger than that of diamond.

The heat sink according to the invention can be used alone, can be used in combination with other heat sinks, or can be used with surface plating. When the heat sink is joined with a semiconductor, it is desirable that solder of Au—Sn or Au—Ge alloy be used.

EXAMPLE 1

This example corresponds to the first method of infiltration. Diamond particles 200 to 300μm in diameter and the alloy (C) of the kind and volume ratio shown in Table 1 were put in a quartz container. The alloys (C) for the samples 1-1 to 1-8 were of a disk shape, and for the samples 1-9 to 1-12, of powder. The amount of the diamond particles was 55 to 65% of the total volume of the heat sink. As for the alloy (C), the volume ratio between silver and copper included in the metal (A) is shown in Table 1; the kind and amount of the metal (B) are also shown in Table 1, where the amount is expressed in the ratio of the number of atoms to that of the total heat sink. The number of atoms of the metal is a value obtained by dividing the weight of the metal by its average atomic weight, for example. The reason for using this figure is that the effect of the metal (B) is determined not by the weight or volume but by the amount of atoms around the surface of the diamond particles.

For the samples 1—1 to 1-6, 1-9, and 1-10, the alloy (C) was melted at $10^{-5}$ Torr or below in a vacuum chamber. For the samples 1-7 and 1-11, the alloy (C) was melted in a pressure vessel with an argon atmosphere at 1 atm; for the samples 1-8 and 1-12, at 3 atms. Kept for about 3 minutes after melting, the samples were removed after cooling to be finished for the designed size of the heat sink.

An outline of the process is shown in FIG. 1. The container used is of quartz, though carbon containers may also be used. Even metal containers may be used if they hardly make a eutectic with the metal or alloy used as the material and they have a melting point higher than 1000° C. In this case, the metal container must be ground to remove the heat sink inside. Although the alloy (C) made of the metal (A) and the metal (B) is shown as a disk in FIG. 1, powders or granules can be used similarly. Powders may either be put on top of the mass of diamond particles or mixed with the diamond particles before being placed in the container.

Although the data is not shown, it was confirmed that even at a pressure higher than 10 atms the heat sink according to the invention can be produced by using a pressure-forming machine so long as an inert gas atmosphere is used.

The thermal conductivity of the completed heat sinks was measured by the laser flash method, and the results are shown in Table 1 along with those of the alloy (C). As can be seen in the table, the heat sink has a much higher thermal conductivity than the alloy (C). This proves that the metal (B) included in the molten alloy (C) reacted with the diamond particles and formed the metal carbide (B') on the surface of the diamond particles, furnishing the strong bonding between the diamond and metal. Analyses confirmed the existence of TiC, ZrC, and HfC on the surface of the diamond particles in the heat sink.

TABLE 1

|  | Content of Alloy (C) | | | Melting | Thermal Conductivity | |
|  | --- | --- | --- | --- | --- | --- |
| Sample No. | Metal (A) (Volume Ratio) | Metal (B) (atm %) | Shape | Point (° C.) | Alloy (C) (W/mK) | Heat Sink (n = 5) (W/mK) |
| 1-1 | Ag:Cu = 0.8:0.18 | Ti = 0.3 | Disk | 840 | 240 | 470~520 |
| 1-2 | Ag:Cu = 0.8:0.18 | Ti = 0.6 | Disk | 840 | 220 | 430~480 |
| 1-3 | Ag:Cu = 0.8:0.18 | Ti = 1.2 | Disk | 840 | 190 | 390~440 |
| 1-4 | Ag:Cu = 0.18:0.8 | Ti = 0.6 | Disk | 840 | 180 | 400~450 |
| 1-5 | Ag:Cu = 0.8:0.18 | Zr = 0.6 | Disk | 840 | 200 | 430~490 |
| 1-6 | Ag:Cu = 0.8:0.18 | Hf = 0.6 | Disk | 840 | 180 | 400~450 |
| 1-7 | Ag:Cu = 0.8:0.18 | Ti = 0.3 | Disk | 840 | 240 | 460~520 |
| 1-8 | Ag:Cu = 0.8:0.18 | Ti = 0.3 | Disk | 840 | 240 | 470~520 |
| 1-9 | Ag:Cu = 0.8:0.18 | Ti = 0.3 | Powder | 840 | 240 | 450~510 |
| 1-10 | Ag:Cu = 0.8:0.18 | Ti = 0.6 | Powder | 840 | 220 | 420~470 |
| 1-11 | Ag:Cu = 0.8:0.18 | Ti = 0.3 | Powder | 840 | 240 | 420~510 |
| 1-12 | Ag:Cu = 0.8:0.18 | Ti = 0.3 | Powder | 840 | 240 | 440~490 |

Note: "n" means the number of samples.

EXAMPLE 2

This example corresponds to the second method of infiltration. The same type of quartz container as used in example 1 was provided, wherein diamond particles 200 to 300 μm in diameter were added until they occupied 55 to 65% of the total volume of the heat sink. The alloys (C) with various kinds and volumes were added as shown in Table 2 in the form of a disk for the samples 2-1 to 2-9 and in powder for the samples 2-10 and 2-11. The sample was heated in the same vacuum degree as example 1 to melt the alloy (C). It was kept under the same condition for 2 minutes, and then the sample was subjected to a temperature rise to evaporate the alloy (C) to such a degree that there exist gaps between the diamond particles. Observation of the removed sample showed that whereas the alloy (C) remained at the bottom of the container, at the upper part of the container there were gaps between the diamond particles with small amounts of the alloy (C) remaining. The sample in this state was put again into a vacuum chamber and the separately provided metal (A) shown in Table 2 was added with the same form and amount as the alloy (C) that was first added. Heating and vacuum treatment were resumed to melt the separately provided metal (A) so that the molten metal (A) can infiltrate into the gaps between the diamond particles. After the infiltration was assumed to be completed, the sample was cooled down to enable the removal of the formed heat sink from the container. Finishing process was performed to obtain the designed heat sink. In example 2 also, although the results are not shown, it was possible to produce the desired heat sink with other alternatives in the processing condition such as a container material, an atmospheric condition, and a form of the alloy as described in example 1.

Thermal conductivity of the completed heat sinks is shown in Table 2. The results show that the heat sink has a higher thermal conductivity than the separately provided metal (A) or the alloy (C). This proves that the metal (B) has a great effect on the thermal conductivity of the completed heat sink.

Figure 2:
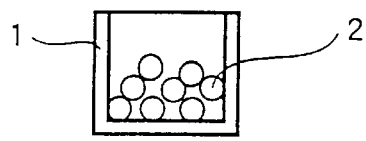
FIG. 2 illustrates another manufacturing method using the infiltration method of the invention. In steps (a) and (b), diamond particles 2 and the alloy (C) 3 are put in a container 1, and in step (c), the alloy (C) 3 is melted, the molten alloy (C) being 4. In step (d), the metal carbide (B') 5 is formed on the surface of individual diamond particles 2, and in step (e), a part of the molten alloy (C) 4 is evaporated. In step (f), the separately provided metal (A) 6 is added to infiltrate. The formed body is removed after it is cooled.
Figure 2:
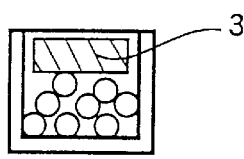
Figure 2:
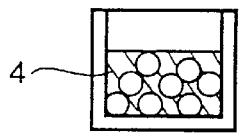
Figure 2:
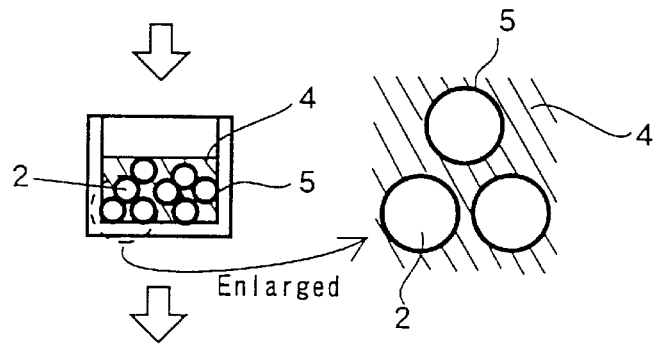
Figure 2:
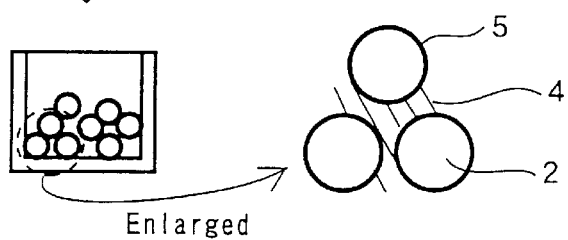
Figure 2:
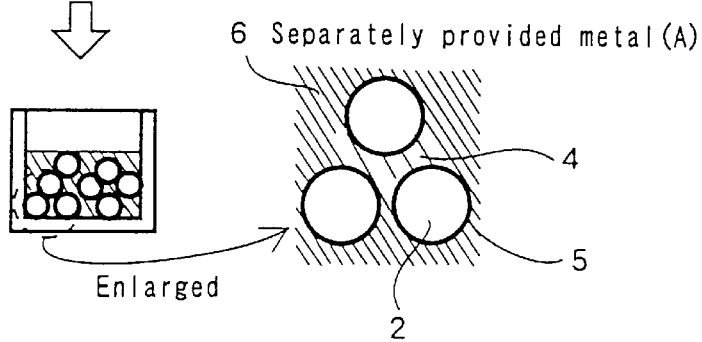
Figure 3:
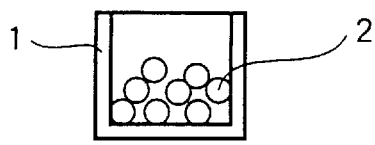
FIG. 3 shows yet another manufacturing method using the infiltration method of the invention. In steps (a) and (b), diamond particles 2 and the alloy (C) and the separately provided metal (A) 7 are put in a container 1. In step (c), the alloy (C) is melted, while the separately provided metal (A) is not melted yet, the two components being 8. In step (d), the metal carbide (B') 5 is formed, and in step (e), the separately provided metal (A) is melted; the molten alloy (C) and molten separately provided metal (A) together being 9. The formed body is removed after it is cooled.
Figure 3:
Figure 3:
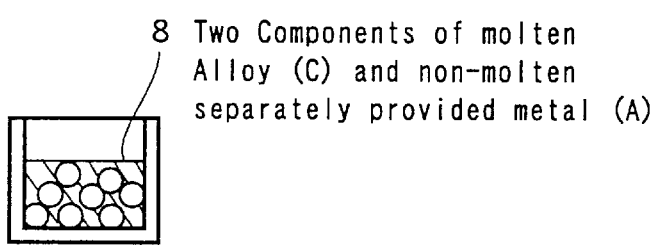
Figure 3:
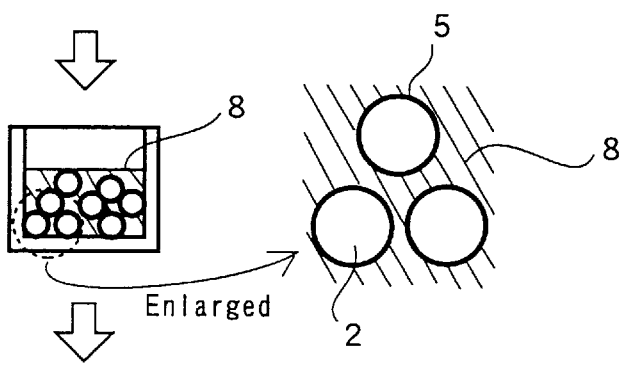
Figure 3:
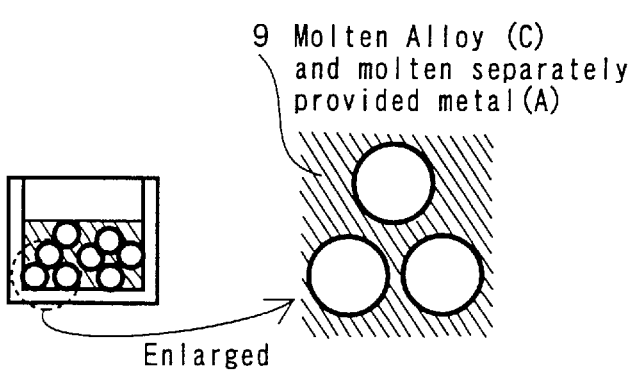

An outline of the process in example 2 is shown in FIG. 2. Although the alloy (C) is shown as a disk in FIG. 2, powders of the same may be mixed with the diamond particles before inserting into the container.

volume as described in example 1 were put into a quartz container. The alloys (C) and separately provided metal (A) were added, as shown in Table 3, each in a form of disk for the samples 3-1 to 3-8 and in a form of powder for the samples 3-9 and 3-10. When powders were used, they were mixed with the diamond particles before inserting into the container. The alloy (C) and the metal (A) are the same weight. The sample was heated under the same vacuum condition as example 1 to selectively melt the alloy (C). Because the alloy (C) has a lower melting point than the separately provided metal (A) to which it is combined, the alloy (C) melted first. The conditions were kept unchanged for 5 minutes to form the metal carbide (B'). Then the temperature was raised to melt the metal (A). Without the alloy (C), the metal (A) has no power to infiltrate into the gaps between the diamond particles because it has poor wettability to diamond. However, when the metal carbide (B') is formed on the surface of the diamond particles due to the melting of the alloy (C), the metal (A) starts its infiltration because it has good wettability to the alloy. The sample was cooled down to remove the formed heat sink from the container. The finishing process was performed to obtain the designed size of the heat sink. An outline of the manufacturing process for this example is in FIG. 3.

Thermal conductivity of the completed heat sinks is shown in Table 3. The results show that the heat sink produced in such a manner as described above has a higher thermal conductivity than the metal used.

TABLE 2

| Sample No. | Content of Alloy (C) | | | Melting Point (° C.) | Separately Provided Metal (A) | Thermal Conductivity Heat Sink |
| | Metal (A) (Volume Ratio) | Metal (B) (atm %) | Shape | | Kind and Volume Ratio | (n = 5) (W/mK) |
| --- | --- | --- | --- | --- | --- | --- |
| 2-1 | Ag:Cu = 0.8:0.18 | Ti = 0.6 | Disk | 860 | Ag | 680~730 |
| 2-2 | Ag:Cu = 0.8:0.18 | Ti = 0.6 | Disk | 860 | Cu | 600~650 |
| 2-3 | Ag:Cu = 0.8:0.18 | Ti = 0.6 | Disk | 860 | Au | 510~560 |
| 2-4 | Ag:Cu = 0.8:0.18 | Ti = 0.6 | Disk | 860 | Al | 460~520 |
| 2-5 | Ag:Cu = 0.8:0.18 | Ti = 0.6 | Disk | 860 | Mg | 280~340 |
| 2-6 | Ag:Cu = 0.8:0.18 | Ti = 0.6 | Disk | 860 | Zn | 230~260 |
| 2-7 | Ag:Cu = 0.8:0.18 | Ti = 0.6 | Disk | 860 | Ag:Cu = 0.8:0.2 | 640~690 |
| 2-8 | Ag:Cu = 0.8:0.16 | Ti = 0.6 | Disk | 860 | Ag:Cu = 0.2:0.8 | 620~670 |
| 2-9 | Ag:Cu = 0.8:0.16 | Ti = 1.2 | Disk | 860 | Ag | 660~720 |
| 2-10 | Ag:Cu = 0.8:0.18 | Ti = 0.6 | Powder | 860 | Ag (Powder) | 680~740 |
| 2-11 | Ag:Cu = 0.8:0.18 | Ti = 0.6 | Powder | 860 | Cu (Powder) | 590~640 |

Note: "n" means the number of samples.

EXAMPLE 3

This example corresponds to the third method of infiltration. The diamond particles having the same size and

TABLE 3

| Sample No. | Content of Alloy (C) | | | Melting Point (° C.) | Separately Provided Metal (A) | Thermal Conductivity Heat Sink |
| | Metal (A) (Volume Ratio) | Metal (B) (atm %) | Shape | | Kind and Volume Ratio | (n = 5) (W/mK) |
| --- | --- | --- | --- | --- | --- | --- |
| 3-1 | Ag:Cu = 0.8:0.18 | Ti = 0.6 | Disk | 830 | Ag | 600~650 |
| 3-2 | Ag:Cu = 0.8:0.18 | Ti = 0.6 | Disk | 830 | Cu | 510~570 |
| 3-3 | Ag:Cu = 0.8:0.18 | Ti = 0.6 | Disk | 830 | Ag:Cu = 0.9:0.1 | 580~630 |
| 3-4 | Ag:Cu = 0.8:0.18 | Ti = 0.6 | Disk | 830 | Ag:Cu = 0.1:0.9 | 560~610 |

TABLE 3-continued

| | Content of Alloy (C) | | | Melting | Separately Provided Metal (A) | Thermal Conductivity Heat Sink |
|---|---|---|---|---|---|---|
| Sample No. | Metal (A) (Volume Ratio) | Metal (B) (atm %) | Shape | Point (° C.) | Kind and Volume Ratio | (n = 5) (W/mK) |
| 3-5 | Ag:Cu = 0.7:0.28 | Ti = 0.6 | Disk | 830 | Ag | 570~630 |
| 3-6 | Ag:Cu = 0.7:0.28 | Ti = 0.6 | Disk | 830 | Cu | 500~550 |
| 3-7 | Ag:Cu = 0.8:0.18 | Ti = 0.3 | Disk | 830 | Ag | 630~680 |
| 3-8 | Ag:Cu = 0.8:0.16 | Ti = 1.2 | Disk | 830 | Ag | 580~630 |
| 3-9 | Ag:Cu = 0.8:0.18 | Ti = 0.6 | Powder | 830 | Ag (Powder) | 580~640 |
| 3-10 | Ag:Cu = 0.8:0.18 | Ti = 0.6 | Powder | 830 | Cu (Powder) | 500~560 |

Note: "n" means the number of samples.

EXAMPLE 4

This example corresponds to the fourth method of infiltration. Diamond particles 200 to 300 μm in diameter, a disk of the alloy (C), and a disk of the separately provided metal (A) shown in Table 4 were put into a quartz container. The samples 4-1 to 4-5 are heated at $10^{-5}$ Torr in a vacuum chamber. The samples 4-6 and 4-7 are heated in an argon gas atmosphere at 1 atm; the sample 4-8, at 3 atms in a pressure vessel. The heating temperature was raised and kept for a while at a temperature roughly equal to the melting point of the metal (A), and then raised to the melting point of the alloy (C). Before the melting of the alloy (C), the molten metal (A) was insufficiently distributed in a form of liquid drops between the diamond particles and on the surface area of the mass of the diamond because it has poor wettability to diamond. Once the alloy (C) was melted, the metal (B) included in the alloy (C) formed the metal carbide (B') on the surface of the diamond particles, and the molten metal (A) infiltrated into the gaps between the diamond particles because it has good wettability to the alloy.

Kept for 2 minutes after the temperature was raised to the melting point of the alloy (C), the sample was gradually cooled down. When it was cooled to room temperature, it was removed from the container to be finished for the designed size of the heat sink.

The amount of the diamond particles used in this example was 55 to 65% of the total volume of the completed heat sink. The weight of the alloy (C) was the same as the metal (A). The amount of the metal (B) included in the alloy (C) was 0.6 atm % for all the samples shown in Table 4, where the amount is expressed in the ratio of the number of atoms to that of the total heat sink.

Measured results of the thermal conductivity of the completed heat sinks are shown in Table 4. These results confirmed that the heat sink has a higher thermal conductivity than the alloy or the metal used. It is noted that the samples 4—4 and 4-5 showed comparable data to those obtained with the samples having the same Ag—Cu system metal shown in examples 2 and 3. As for the heating environment, the results obtained with samples prepared in a vacuum, under atmospheric pressure, or under pressurized conditions showed no significant difference so long as an inert gas environment was used as is seen with the samples 4-1, 4-6, and 4-8.

TABLE 4

| | Content of Alloy (C) | | | Melting | Separately Provided Metal (A) | Thermal Conductivity Heat Sink |
|---|---|---|---|---|---|---|
| Sample No. | Metal (A) (Volume Ratio) | Metal (B) (atm %) | Shape | Point (° C.) | Kind and Volume Ratio | (n = 5) (W/mK) |
| 4-1 | Ag:Cu = 0.8:0.18 | Ti = 0.6 | Disk | 830 | Al | 330~380 |
| 4-2 | Ag:Cu = 0.8:0.18 | Ti = 0.6 | Disk | 830 | Mg | 230~290 |
| 4-3 | Ag:Cu = 0.8:0.18 | Ti = 0.6 | Disk | 830 | Zn | 180~240 |
| 4-4 | Ag:Cu = 0.8:0.18 | Ti = 0.6 | Disk | 830 | Ag:Cu = 0.8:0.2 | 580~630 |
| 4-5 | Ag:Cu = 0.8:0.18 | Ti = 0.6 | Disk | 830 | Ag:Cu = 0.2:0.8 | 560~610 |
| 4-6 | Ag:Cu = 0.8:0.18 | Ti = 0.6 | Disk | 830 | Al | 350~400 |
| 4-7 | Ag:Cu = 0.8:0.18 | Ti = 0.6 | Disk | 830 | Mg | 240~280 |
| 4-8 | Ag:Cu = 0.8:0.18 | Ti = 0.6 | Disk | 830 | Al | 350~410 |

Note: "n" means the number of samples.

EXAMPLE 5

This example corresponds to the second method of sintering. Diamond particles 200 to 300 μm in diameter, powders of the alloy (C), and powders of the separately provided metal (A) shown in Table 5 were mixed. The amount of the diamond particles was 40 to 50% of the total volume of the heat sink. As for the alloy (C), the volume ratio between silver and copper included in the metal (A) is shown in Table 5; the amount of the metal (B) is also shown in Table 5, where the amount is expressed in the ratio of the number of atoms to that of the total heat sink. The metal (A) was so selected that it has a higher melting point than the alloy (C). The weight of the alloy (C) was the same as that of the metal (A). For comparison purpose, the samples 5-3 and 5-6 were prepared as the sales without the alloy (C), and the sample 5-7, without the metal (A).

A mixed body of the diamond particles and powders was pressure formed to the designed form by a press at a pressure of about 2000 kg/cm². The formed body was put into a sintering furnace and heated in an inert gas atmosphere to a temperature beyond the melting point of the alloy (C), with the temperature kept for 1 minute. Gradually cooled to the ambient temperature, the sample was ground to the designed size.

The measured results of the thermal conductivity of the completed heat sinks are shown in Table 5 along with those of the metal part only. The results show that the metal (B) included in the alloy (C) plays an important role in determining the total thermal conductivity of the completed heat sink, because the samples without the metal (B) showed a lower thermal conductivity than others as is seen in the data with the samples 5-3 and 5-6. Analyses confirmed the existence of TiC on the surface of the diamond particles in the heat sink so produced as described above; i.e., the formation of the metal carbide (B') was confirmed. The observation of the diamond particles appearing on the cross section when a completed heat sink was dissected at several points revealed that a film of TiC covers a quarter or more of the surface of the diamond particles, not necessarily the entire surface.

Figure 4:
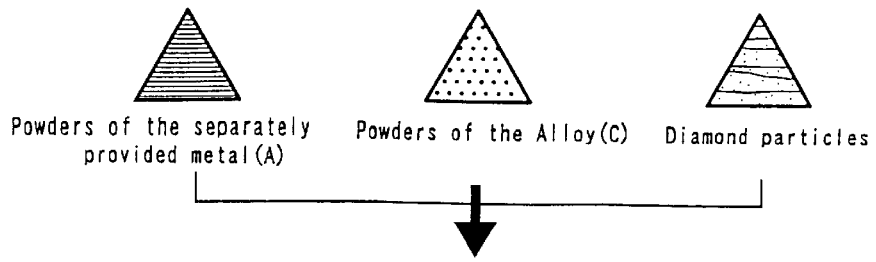
FIG. 4 shows a manufacturing method using the sintering method of the invention. In step (a), diamond particles, powders of the alloy (C), and powders of the separately provided metal (A) are provided as the material, and in step (b), they are mixed. In step (c), the mixed materials are put in a mold to be subjected to pressure formation. The formed body is removed, and, in step (d), sintered in a furnace. In this process, the metal carbide (B') is formed on the surface of individual diamond particles. The sintered body is removed after it is cooled.
Figure 4:
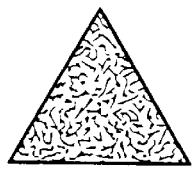
Figure 4:
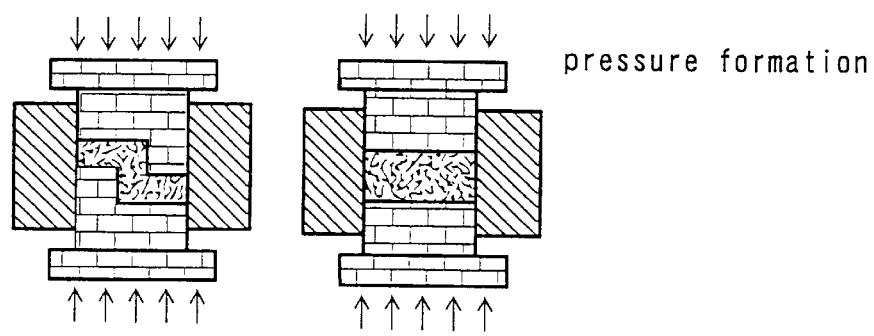
Figure 4:
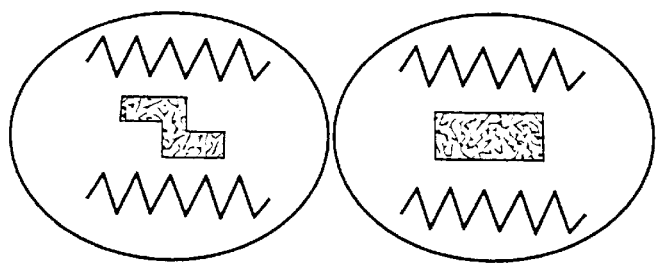
Figure 4:

An outline of the process in example 5 is shown in FIG. 4. Diamond particles, powders of the alloy (C), and powders of the metal (A) were mixed by a mixer. The mixed body was pressure formed to the designed form by a press. The formed body was heated in an inert gas or reducing atmosphere in a vacuum, under atmospheric pressure, or under a pressurized condition to a temperature of sintering for the alloy (C), with the temperature kept for 1 minute. If no alloy (C) was used, the temperature condition was used for the single metal (A). Gradually cooled to the ambient temperature, the sintered body was ground to the designed size of the heat sink. As for the samples 5-3 and 5-6 having no alloy (C), grinding the same took time because of the poor bonding between the diamond particles and the metal (A) causing strong grinding to crumble the form.

example 5 was used. Samples were kept at a sintering temperature between 600 and 900° C. for 1 minute as in example 5. The measured results of the thermal conductivity of the completed heat sinks are shown in Table 6. The data of the samples 6-1 and 6-2 show that thermal conductivity of the completed heat sink is substantially lower than that of the metal part, manifesting no effect of the diamond. Observation of the surface of the diamond particles on a cross section when a completed heat sink was dissected revealed that no TiC was formed. The results confirmed that below the melting point of the alloy (C), 830° C., the bonding between the diamond particles and the metal is insufficient and no effect of composition of materials is obtained.

TABLE 6

| | | Thermal Conductivity | |
|---|---|---|---|
| Sample No. | Sintering Temperature (° C.) | Metal Part (W/mK) | Heat Sink (n = 5) (W/mK) |
| 6-1 | 600 | 220 | 30~70 |
| 6-2 | 750 | 250 | 80~140 |
| 6-3 | 830 | 300 | 620~680 |
| 6-4 | 850 | 320 | 570~610 |
| 6-5 | 900 | 310 | 540~600 |

Note: "n" means the number of samples.

EXAMPLE 7

This example was carried out to clarify the effect of the metal (B) upon the thermal conductivity of the completed heat sink. A mixed body of the diamond particles, having about a 300 μm diameter and occupying 40 to 50% of the total volume of the heat sink, and powders of the alloy (C) shown in Table 7 was pressure formed at about 2000 kg/cm². The formed bodies of the samples 7-1 to 7—7 were put in a sintering furnace and sintered in a hydrogen gas atmosphere at 1 atm. The samples 7-8 and 7-9 were put in a vacuum chamber and sintered in a vacuum of $10^{-5}$ Torr or below. Kept for 0.5 minutes under the sintering condition and cooled, the sample was then ground to the designed size

TABLE 5

| | | | | | | Thermal Conductivity | |
|---|---|---|---|---|---|---|---|
| | Contents of Alloy (C) | | Melting | Separately | | Heat Sink | |
| Sample No. | Metal (A) (Volume Ratio) | Metal (B) (atm %) | Point (° C.) | Provided Metal (A) Kind | Metal Part (W/mK) | (n = 5) (W/mK) | |
| 5-1 | Ag:Cu = 0.78:0.2 | Ti = 0.6 | 830 | Ag | 300 | 570~620 | |
| 5-2 | Ag:Cu = 0.9:0.08 | Ti = 0.6 | 830 | Ag | 390 | 680~740 | |
| 5-3 | None | None | 830 | Ag | 400 | 210~260 | |
| 5-4 | Ag:Cu = 0.78:0.2 | Ti = 0.6 | 830 | Cu | 100 | 330~370 | |
| 5-5 | Ag:Cu = 0.08:0.9 | Ti = 0.6 | 830 | Cu | 360 | 580~630 | |
| 5-6 | None | None | 830 | Cu | 380 | 180~240 | |
| 5-7 | Ag:Cu = 0.78:0.2 | Ti = 0.6 | 830 | None | 250 | 280~330 | |

Note: "n" means the number of samples.

EXAMPLE 6

This example was carried out to examine the effect of sintering temperature upon the conductivity of the completed heat sink. The same combination of diamond particles, powders of the alloy (C), and powders of the separately provided metal (A) as used in the sample 5-1 in of heat sink. Thermal conductivity of the heat sinks is shown in Table 7. The samples 7-1 and 7—7 do not have the metal (B) to be included in the alloy (C). Because they only have the separately provided metal (A), sintering did not proceed and the samples disintegrated without achieving the desired formation. In contrast to this, the samples having the metal (B) included in the alloy (C) exhibit a much higher thermal conductivity than the metal used.

TABLE 7

| Sample No. | Contents of Alloy (C) | | Melting Point (° C.) | Thermal Conductivity Heat Sink (n = 5) (W/mK) |
|---|---|---|---|---|
| | Metal (A) (Volume Ratio) | Metal (B) (atm %) | | |
| 7-1 | Ag:Cu = 0.78:0.2 | None | 870 | Sample Not Formed |
| 7-2 | Ag:Cu = 0.88:0.1 | Ti = 0.6 | 870 | 670~710 |
| 7-3 | Ag:Cu = 0.83:0.15 | Ti = 0.6 | 870 | 565~615 |
| 7-4 | Ag:Cu = 0.78:0.2 | Ti = 0.6 | 870 | 280~320 |
| 7-5 | Ag:Cu = 0.2:0.78 | Ti = 0.6 | 870 | 330~370 |
| 7-6 | Ag:Cu = 0.1:0.88 | Ti = 0.6 | 870 | 580~640 |
| 7-7 | Ag:Cu = 0.2:0.78 | None | 870 | Sample Not Formed |
| 7-8 | Ag:Cu = 0.88:0.1 | Ti = 0.6 | 870 | 650~710 |
| 7-9 | Ag:Cu = 0.83:0.15 | Ti = 0.6 | 870 | 575~625 |

Note: "n" means the number of samples.

EXAMPLE 8

This example was conducted to examine the effect of the ratio of the number of atoms in the metal (B) using the materials similar to those used in example 5. Diamond particles had diameters between 200 and 300 $\mu$m. The separately provided metal (A) was a purified silver or copper. The alloy (C) comprises the metal (A) of the Ag—Cu system and the metal (B) of titanium. The resultant system is a quaternary system of diamond-Ag—Cu—Ti. To observe the effect of the metal (B), the ratio of the number of atoms of titanium to that of the total heat sink was varied from 0 to 8 atm %, whereas the amount of the diamond particles was fixed at about 50 vol % and two values of the volume ratio of silver were used; 90% and 20%.

Figure 5:
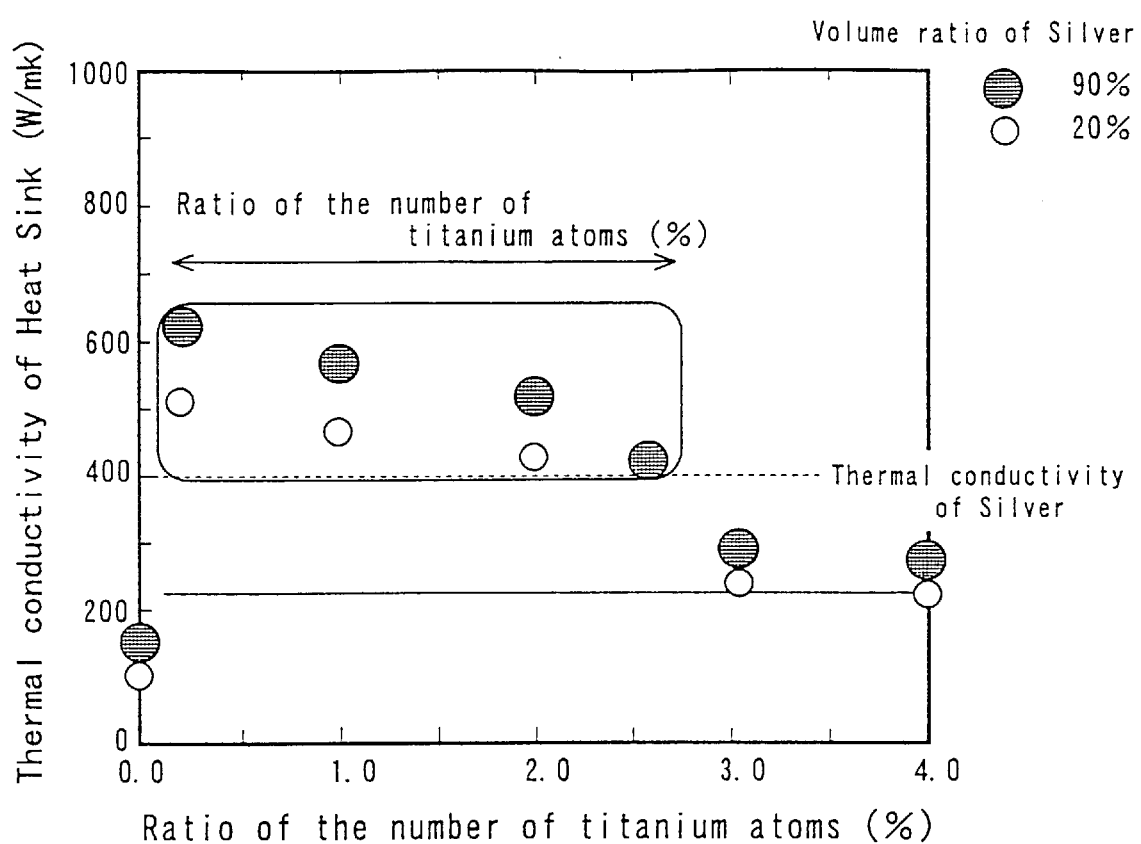
FIG. 5 is a graph showing the effects of the amount of the metal (B) in the invention.

The diamond particles, powers of the alloy (C), and powders of the metal (A) were mixed by a ball mill to be formed at a pressure between 1000 and 7000 kg/cm²—mainly at 2000 kg/cm². The formed body was sintered in a hydrogen atmosphere under atmospheric pressure. The sintered sample was ground to the designed size. The measured results of the thermal conductivity on the samples are shown in FIG. 5, wherein omitted are the data for more than 4 atm % in the ratio of the number of atoms of the metal (B), titanium in this case.

This result shows that the thermal conductivity of the heat sink exceeds that of silver when the ratio of the number of atoms of titanium to that of the total heat sink lies between 0.01 and 2.5 atm %, inclusive. Similar data is obtained when zirconium or hafnium is used as the metal (B). In summary, the above results demonstrate that the most suitable amount of the metal (B) lies between 0.01 and 2.5 atm %, inclusive.

EXAMPLE 9

In selecting the metal (A) to be included in the alloy (C), it must be noted that some candidates are very effective while others are not. Especially for the Ag—Cu system, it is desirable that the ratio be so selected that either metal can exist as a single metal, because an alloy of silver and copper reduces the thermal conductivity of the constituent metals. This example was conducted to clarify the effect of the composition of the metal (A). The sample was prepared by the infiltration method described in example 1, with the Ag—Cu system as the metal (A) and titanium as the metal (B). Diamond particles, having diameters from 200 to 300 $\mu$m and a volume varied from 40 to 65% of the total heat sink, were put into a quartz container, and a disk of Ag—Cu—Ti alloy as the alloy (C) was placed there. The sample was heated in an argon gas atmosphere at 3 atms in a pressure vessel to infiltrate the alloy (C) into the gaps between the diamond particles. Kept for 3 minutes under the heating condition and then cooled to a room temperature, the sample was ground to the designed size of the heat sink. As the composition variation in the alloy (C) in manufacturing samples, the ratio between silver and copper was varied and the ratio of the number of atoms of titanium to that of the total heat sink was varied from 0.5 to 1 atm %.

The measured results of thermal conductivity of the heat sinks are shown as a graph in FIG. 6. FIG. 6 is a ternary graph wherein each apex of the triangle shows the 100% volume of the material written there. The graph shows the variation of the thermal conductivity of the heat sink due to the variation of the ratio between silver and copper, with the volume of diamond particles varied from 40 to 65%. In this graph, the large circle shows that the thermal conductivity is more than 500 W/mK; the small circle, more than 400 W/mK; and the square, less than 300 W/mK. It is clear that the thermal conductivity of the heat sink is affected by the ratio between silver and copper. More specifically, when the value Ag/(Ag+Cu) is more than 0.6 or the value Cu/(Ag+Cu) is more than 0.8, the thermal conductivity exhibits a higher value. The reason for this tendency is considered to be that the existence of a single metal rather than an alloy maintains and improves the total thermal conductivity because the thermal conductivity of the alloy of silver and copper exhibits extremely low value compared with that of the constituent metals themselves. Therefore, when the Ag—Cu system is used as the metal (A), the present invention is most effectively embodied when the above-mentioned ratio is applied.

EXAMPLE 10

This example corresponds to the fourth method of sintering. In FIG. 4, powders of the separately provided metal (A) were replaced by powders of the metal (D). Diamond particles having an average diameter of about 300 $\mu$m were used and the volume ratio thereof to the total heat sink was 40 to 50%. The volume ratio of the metal (A) in the alloy (C) and the ratio of the number of atoms of the metal (B) are shown in Table 8. In accordance with the process shown in FIG. 4, diamond particles and metal powders were mixed and pressed at 2000 kg/cm². The formed body was sintered in a hydrogen reducing atmosphere under atmospheric pressure at a temperature beyond the melting point of the alloy (C) in a sintering furnace. After cooling the sintered body was ground to the designed size of the heat sink.

Thermal conductivity of the completed heat sinks is shown in Table 8 along with those of metal parts alone. The data obtained with the samples 5-1 and 5—5, having the metal (A) instead of the metal (D), in example 5 are cited in Table 8 as a reference. The results show that the thermal conductivity of the completed heat sink is much higher than that of the metal parts alone. It was observed that powders of tungsten or molybdenum in the heat sink were distributed among the diamond particles without congregating, so that heat is conducted principally through silver or copper parts in the alloy (C) without the intervention of the additional metal powder. The primary function of tungsten and molybdenum is to absorb the thermal stress in the heat sink by their intermediate amount of expansion between the diamond and the metal (A) when heated.

TABLE 8

| Sample No. | Contents of Alloy (C) Metal (A) (Volume Ratio) | Metal (B) (atm %) | Melting Point (° C.) | Separately Provided Metal (A) or (D) (Kind) | Metal Part (W/mK) | Thermal Conductivity Heat Sink (n = 5) (W/mK) |
|---|---|---|---|---|---|---|
| 8-1 | Ag:Cu = 0.78:0.2 | Ti = 0.6 | 870 | W (D) | 190 | 380~420 |
| 8-2 | Ag:Cu = 0.08:0.9 | Ti = 0.6 | 870 | W (D) | 180 | 365~415 |
| 8-3 | Ag:Cu = 0.78:0.2 | Ti = 0.6 | 870 | Mo (D) | 160 | 340~380 |
| 8-4 | Ag:Cu = 0.08:0.9 | Ti = 0.6 | 870 | Mo (D) | 150 | 335~385 |
| 5-1 | Ag:Cu = 0.78:0.2 | Ti = 0.6 | 830 | Ag (A) | 300 | 570~620 |
| 5-5 | Ag:Cu = 0.08:0.9 | Ti = 0.6 | 830 | Cu (A) | 360 | 580~630 |

Note: "n" means the number of samples.

EXAMPLE 11

Figure 7:
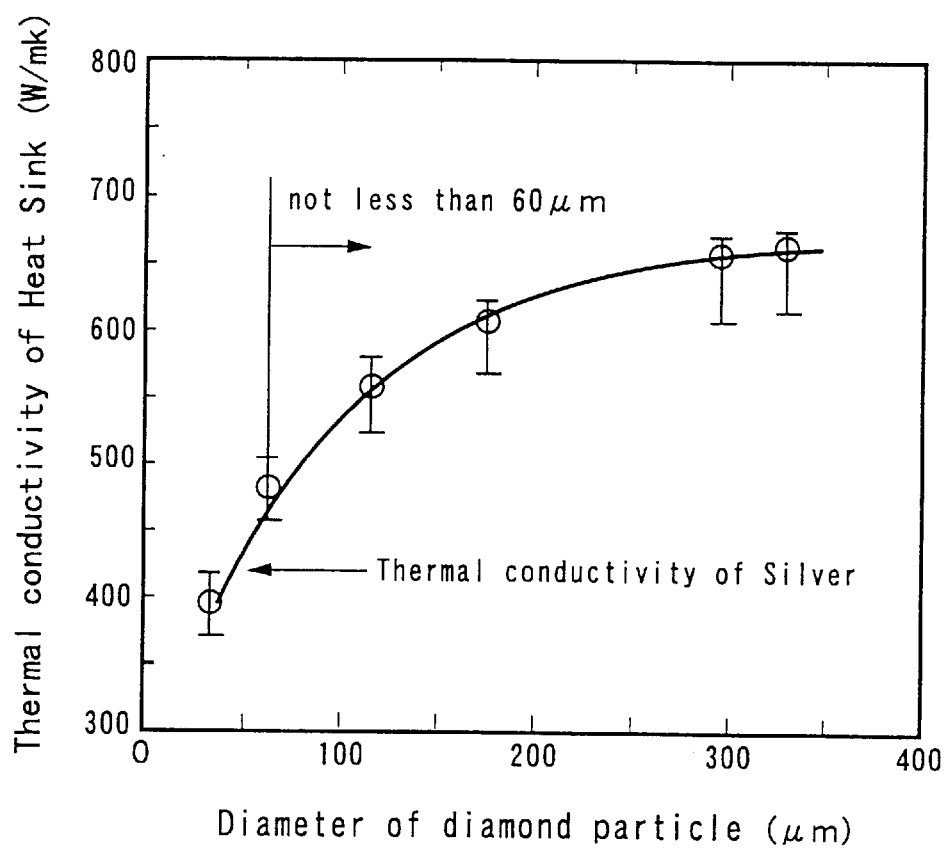
FIG. 7 is a graph showing how the thermal conductivity of a heat sink is affected by the diameter.

This example was performed to examine the effect of sintering temperature. Diamond particles having an average diameter of about 300 μm and a volume ratio of 40 to 50% to the total heat sink, powders of the alloy (C), and powders of the separately provided metal (A) shown in Table 9 were mixed to be pressure formed. The formed body was sintered in a hydrogen atmosphere at a temperature shown in Table 9 in a sintering furnace. The samples 9-3 and 9-6 having no alloy (C) disintegrated during the sintering process without achieving the desired formation. The sintering temperature used was the melting point of the separately provided metal (A) that melts at a higher temperature than the alloy (C). Table 9 shows that the completed heat sink has a much higher thermal conductivity than the metal used. The samples in Table 9 have the same composition as those in Table 5 for example 5; for instance, the sample 9-1 corresponds to 5-1. It is clear that the sample 9-1 has a noticeably higher thermal conductivity than the sample 5-1. This difference is attributable to the difference in the sintering temperature; the sample 9-1 was sintered at 980° C., whereas the sample 5-1, at about 830° C. Observation of sections of a completed heat sink of this example reveals that the sample has no different phases of two metal parts, the alloy (C) and the metal (A), which exist in the sample made by example 5. It is considered that this uniform metal phase is the reason why the samples in this example have a higher thermal conductivity than those in example 5.

unchanged from those in the sample 5-1 in example 5. The volume ratio of the diamond particles was adjusted to 50% of the total heat sink. Measured results are summarized in a graph in FIG. 7, where the axis of abscissa represents the average diameter of the diamond particles, and the axis of ordinate, the thermal conductivity of the completed heat sink. As is seen in the graph, thermal conductivity decreases with the decreasing diameter. It is noted that when the diameter is not more than 60 μm, the thermal conductivity becomes lower than that of the metal (A), silver in this case. The reason is that the reduction in diamond diameter brings the increase in the percentage of the metal carbide that exists in the heat path. The metal carbide (B') formed on the surface of the diamond particles has poor thermal conductivity and has a tendency to reduce the total thermal conductivity despite the high conductivity of the diamond. In this sense, the larger the diameter of the diamond particles, the better. However, if the diameter is too large, the diamond particles cannot compose a thin heat sink and the metal cannot absorb the thermal stress caused by the difference in expansion between the diamond particles and the metal. Nothing serious takes place when the diameter is less than 700 μm, and beyond that cracks may appear at the time of bonding with a semiconductor substrate. In conclusion, it is desirable that the diameter of the diamond particles be between 60 and 700 μm, inclusive, in the present invention.

What is claimed is:

1. A heat sink for semiconductors, comprising:
   a metal (A) including at least one member selected from the group consisting of Cu, Ag, Au, Al, Mg, and Zn;

TABLE 9

| Sample No. | Contents of Alloy (C) Metal (A) (Volume Ratio) | Metal (B) (atm %) | Sintering Temp. (° C.) | Separately Provided Metal (A) Kind | Metal Part (W/mK) | Thermal Conductivity Heat Sink (n = 5) (W/mK) |
|---|---|---|---|---|---|---|
| 9-1 | Ag:Cu = 0.78:0.2 | Ti = 0.6 | 980 | Ag | 300 | 690~730 |
| 9-2 | Ag:Cu = 0.9:0.08 | Ti = 0.6 | 980 | Ag | 390 | 750~810 |
| 9-3 | None | None | 980 | Ag | 400 | Not Formed |
| 9-4 | Ag:Cu = 0.78:0.2 | Ti = 0.6 | 1100 | Cu | 100 | 440~480 |
| 9-5 | Ag:Cu = 0.08:0.9 | Ti = 0.6 | 1100 | Cu | 360 | 660~720 |
| 9-6 | None | None | 1100 | Cu | 380 | Not Formed |

Note: "n" means the number of samples.

EXAMPLE 12

This example was conducted to examine the effect of the diameter of the diamond particles upon the thermal conductivity of the heat sink. For this purpose, the average diameter of the diamond particles was varied with other conditions a metal carbide (B') made from a metal (B) including at least one member selected from the group consisting of metals of groups 4a and 5a of the Periodic Table and chromium; and a plurality of diamond particles, the heat sink having a structure wherein at least a quarter of a surface area of individual diamond particles is covered with the metal carbide (B'), wherein the diamond particles covered with the metal carbide (B') are separated from one another by the metal (A), and wherein a layer of the metal (B) is absent from a portion of an area around the metal carbide (B') which covers the diamond particles.

2. The heat sink as defined in claim 1, wherein an average diameter of the diamond particles lies between 60 and 700 µm, inclusive.

3. The heat sink as defined in claim 1, wherein the metal (B) comprises at least one member selected from the group consisting of Ti, Zr, and Hf.

4. A manufacturing method to form the heat sink for semiconductors as defined in claim 1, comprising:
   (a) placing a plurality of diamond particles in a container or mold;
   (b) placing an alloy (C) comprising the metal (A) and the metal (B) in the container or mold together with the diamond particles, at the same time or after the diamond particles are placed in the container or mold; and
   (c) melting the alloy (C) with heat in a vacuum or under a pressure below 1,000 atms, so that the metal (B) released from the alloy (C) reacts with the diamond particles to form the metal carbide (B') on the surface of the individual diamond particles, and so that the molten alloy (C) infiltrates into gaps between the diamond particles.

5. A manufacturing method to form a heat sink for semiconductors as defined in claim 1, comprising:
   (a) placing a plurality of diamond particles in a container or mold;
   (b) placing an alloy (C) comprising the metal (A) and the metal (B) in the container or mold together with the diamond particles, at the same time or after the diamond particles are placed in the container or mold;
   (c) melting the alloy (C) with heat in a vacuum or under a pressure below 1000 atms, so that the metal (B) released from the alloy (C) reacts with the diamond particles to form the metal carbide (B') on the surface of the individual diamond particles;
   (d) evaporating a part of the alloy (C) in a vacuum; and
   (e) adding metal (A) and infiltrating the metal (A), which is separately provided, in a vacuum or under a pressure below 1000 atms.

6. A manufacturing method to form a heat sink for semiconductors as defined in claim 1, comprising:
   (a) placing a plurality of diamond particles in a container or mold;
   (b) placing an alloy (C) comprising the metal (A) and the metal (B), together with the metal (A), which is separately provided, the metal (A) having a higher melting point than that of the alloy (C), in the container or mold together with the diamond particles, at the same time or after the diamond particles are placed in the container or mold;
   (c) melting the alloy (C) with heat in a vacuum or under a pressure below 1000 atms, so that the metal (B) released from the alloy (C) reacts with the diamond particles to form the metal carbide (B') on the surface of the individual diamond particles; and
   (d) melting the separately provided metal (A).

7. A manufacturing method to form a heat sink for semiconductors as defined in claim 1, comprising:
   (a) placing a plurality of diamond particles in a container or mold;
   (b) placing an alloy (C) comprising the metal (A) and the metal (B), together with the metal (A), which is separately provided, the metal (A) having a lower melting point than that of the alloy (C), in the container or mold together with the diamond particles, at the same time or after the diamond particles are placed in the container or mold;
   (c) melting the separately provided metal (A) with heat in a vacuum or under a pressure below 1000 atms; and
   (d) melting the alloy (C) so that the metal (B) released from the alloy (C) reacts with the diamond particles to form the metal carbide (B') around the diamond particles.

8. A manufacturing method to form a heat sink for semiconductors as defined in claim 1, comprising:
   (a) mixing powders of an alloy (C), comprising the metal (A) and the metal (B), with a plurality of diamond particles;
   (b) pressure forming the mixture to form a body; and
   (c) sintering the formed body at a temperature above the melting point of the alloy (C), so that the metal (B) included in the alloy (C) reacts with the diamond particles to form the metal carbide (B') around the diamond particles.

9. A manufacturing method to form a heat sink for semiconductors as defined in claim 1, comprising:
   (a) mixing,
      powders of an alloy (C), comprising the metal (A) and the metal (B),
      powders of the metal (A), which is separately provided and has a higher melting point than that of the alloy (C), and
      a plurality of diamond particles;
   (b) pressure forming the mixture to form a body; and
   (c) sintering the formed body at a temperature above the melting point of the alloy (C), and below the melting point of the separately provided metal (A), so that the metal (B) included in the alloy (C) reacts with the diamond particles to form the metal carbide (B') around the diamond particles.

10. A heat sink for semiconductors, comprising:
   a metal (A) including at least one member selected from the group consisting of Cu, Ag, Au, Al, Mg, and Zn;
   a metal carbide (B') made from a metal (B) including at least one member selected from the group consisting of metals of groups 4a and 5a of the Periodic Table and chromium; and
   a plurality of diamond particles,
   the heat sink having a structure wherein at least a quarter of a surface area of individual diamond particles is covered with the metal carbide (B'), wherein the diamond particles covered with the metal carbide (B') are separated from one another by the metal (A), and wherein the metal (A) further comprises a metal (D), being at least one member selected from the group consisting of tungsten, molybdenum, and alloys thereof.

11. A manufacturing method to form a heat sink for semiconductors as defined in claim 10, comprising:
   (a) mixing,
      powders of an alloy (C) comprising the metal (A) and the metal (B),
      powders of the metal (D), which has a higher melting point than that of the alloy (C), and a plurality of diamond particles;

(b) pressure forming the mixture to form a body; and (c) sintering the formed body at a temperature above the melting point of the alloy (C) and below the melting point of the metal (D), so that the metal (B) included in the alloy (C) reacts with the diamond particles to form the metal carbide (B') around the diamond particles.

12. A manufacturing method to form a heat sink for semiconductors as defined in claim 1, comprising:

(a) mixing,
    powders of an alloy (C) comprising the metal (A) and the metal (B),
    powders of the metal (A), which is separately provided and which has a higher melting point than that of the alloy (C), and
    a plurality of diamond particles;

(b) pressure forming the mixture to form a body; and (c) sintering the formed body at a temperature above the melting point of the separately provided metal (A, so that the metal (B) included in the alloy (C) reacts with the diamond particles to form the metal carbide (B') around the diamond particles.

13. A heat sink for semiconductors, comprising:

a metal (A) including at least one member selected from the group consisting of Cu, Ag, Au, Al, Mg, and Zn;

a metal carbide (B') made from a metal (B) including at least one member selected from the group consisting of metals of groups 4a and 5a of the Periodic Table and chromium; and a plurality of diamond particles, the heat sink having a structure wherein at least a quarter of a surface area of individual diamond particles is covered with the metal carbide (B'), wherein the diamond particles covered with the metal carbide (B') are separated from one another by the metal (A), and wherein a ratio of the number of atoms of the metal (B) to that of the whole heat sink lies between 0.01 and 2.5 atm %, inclusive.

14. A heat sink for semiconductors, comprising:

a metal (A) including at least one member selected from the group consisting of Cu, Ag, Au, Al, Mg, and Zn;

a metal carbide (B') made from a metal (B) including at least one member selected from the group consisting of metals of groups 4a and 5a of the Periodic Table and chromium; and a plurality of diamond particles, the heat sink having a structure wherein at least a quarter of a surface area of individual diamond particles is covered with the metal carbide (B'), wherein the diamond particles covered with the metal carbide (B') are separated from one another by the metal (A), and wherein the metal (A) comprises an alloy of Ag and Cu, with the condition that $Ag \geqq 0.6$ or $Cu \geqq 0.8$ in the volume ratio between the two is fulfilled.

* * * * *